(12) United States Patent
Dhindsa et al.

(10) Patent No.: US 9,793,126 B2
(45) Date of Patent: Oct. 17, 2017

(54) ION TO NEUTRAL CONTROL FOR WAFER PROCESSING WITH DUAL PLASMA SOURCE REACTOR

(71) Applicant: Lam Research Corporation, Fremont, CA (US)

(72) Inventors: Rajinder Dhindsa, Pleasanton, CA (US); Sang Ki Nam, Danville, CA (US); Alexei Marakhtanov, Albany, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 870 days.

(21) Appl. No.: 14/033,241

(22) Filed: Sep. 20, 2013

(65) Prior Publication Data

US 2015/0083582 A1 Mar. 26, 2015
US 2017/0213747 A9 Jul. 27, 2017

Related U.S. Application Data

(63) Continuation-in-part of application No. 12/850,552, filed on Aug. 4, 2010, now Pat. No. 8,869,742.

(51) Int. Cl.
| | |
|---|---|
| *C23C 14/34* | (2006.01) |
| *H01L 21/3065* | (2006.01) |
| *H01J 37/32* | (2006.01) |

(52) U.S. Cl.
CPC .... *H01L 21/3065* (2013.01); *H01J 37/32357* (2013.01); *H01J 37/32422* (2013.01); *H01J 2237/334* (2013.01)

(58) Field of Classification Search
CPC ............ H01L 21/3065; H01J 37/32357; H01J 37/32422; H01J 2237/334
See application file for complete search history.

(56) References Cited

U.S. PATENT DOCUMENTS 3,849,276 A 11/1974 Greiner
4,600,464 A 7/1986 Desilets et al.
(Continued)

FOREIGN PATENT DOCUMENTS

CN 1716530 A 1/2006
CN 101174107 A 5/2008
(Continued)

OTHER PUBLICATIONS

U.S. Patent Application entitled "Ion Beam Etching System," Singh et al., U.S. Appl. No. 14/637,260, filed Mar. 3, 2015.
(Continued)

*Primary Examiner* — John Brayton
(74) *Attorney, Agent, or Firm* — Weaver Austin Villeneuve & Sampson LLP

(57) ABSTRACT

The disclosed techniques relate to methods and apparatus for etching a substrate. A plate assembly divides a reaction chamber into a lower and upper sub-chamber. The plate assembly includes an upper and lower plate having apertures therethrough. When the apertures in the upper and lower plates are aligned, ions and neutral species may travel through the plate assembly into the lower sub-chamber. When the apertures are not aligned, ions are prevented from passing through the assembly while neutral species are much less affected. Thus, the ratio of ion flux:neutral flux may be tuned by controlling the amount of area over which the apertures are aligned. In certain embodiments, one plate of the plate assembly is implemented as a series of concentric, independently movable injection control rings. Further, in some embodiments, the upper sub-chamber is implemented as a series of concentric plasma zones separated by walls of insulating material.

20 Claims, 7 Drawing Sheets

(56) References Cited

U.S. PATENT DOCUMENTS

| | | |
|---|---|---|
| 5,221,366 A | 6/1993 | Roberts et al. |
| 5,248,371 A | 9/1993 | Maher et al. |
| 5,431,774 A | 7/1995 | Douglas |
| 5,474,648 A | 12/1995 | Patrick et al. |
| 5,476,182 A | 12/1995 | Ishizuka et al. |
| 5,705,443 A | 1/1998 | Stauf et al. |
| 5,710,486 A | 1/1998 | Ye et al. |
| 6,007,673 A | 12/1999 | Kugo et al. |
| 6,013,580 A | 1/2000 | Yanagida |
| 6,101,970 A | 8/2000 | Koshimizu |
| 6,162,323 A | 12/2000 | Koshimizu |
| 6,214,162 B1 | 4/2001 | Koshimizu |
| 6,238,527 B1 | 5/2001 | Sone et al. |
| 6,267,074 B1* | 7/2001 | Okumura ............ C23C 16/5096 118/723 ER |
| 6,352,049 B1 | 3/2002 | Yin et al. |
| 6,689,283 B2 | 2/2004 | Hattori et al. |
| 6,794,301 B2 | 9/2004 | Savas |
| 6,851,384 B2 | 2/2005 | Yuda et al. |
| 6,861,643 B2 | 3/2005 | Ichiki et al. |
| 7,244,474 B2 | 7/2007 | Hanawa et al. |
| 7,291,360 B2 | 11/2007 | Hanawa et al. |
| 7,311,796 B2 | 12/2007 | Goto et al. |
| 7,520,999 B2 | 4/2009 | Chandrachood et al. |
| RE40,951 E | 11/2009 | Kodaira et al. |
| 7,695,590 B2 | 4/2010 | Hanawa et al. |
| 7,749,353 B2 | 7/2010 | Rusu et al. |
| 7,767,561 B2 | 8/2010 | Hanawa et al. |
| 7,909,961 B2 | 3/2011 | Kumar et al. |
| 8,058,156 B2 | 11/2011 | Hanawa et al. |
| 8,349,128 B2 | 1/2013 | Todorow et al. |
| 8,356,575 B2 | 1/2013 | Sasaki et al. |
| 9,017,526 B2 | 4/2015 | Singh et al. |
| 9,039,911 B2 | 5/2015 | Hudson et al. |
| 9,147,581 B2 | 9/2015 | Guha |
| 9,230,819 B2 | 1/2016 | Paterson et al. |
| 9,245,761 B2 | 1/2016 | Singh et al. |
| 9,257,295 B2 | 2/2016 | Singh et al. |
| 9,418,859 B2 | 8/2016 | Hudson et al. |
| 9,431,269 B2 | 8/2016 | Guha |
| 9,633,846 B2 | 4/2017 | Paterson et al. |
| 2001/0008805 A1 | 7/2001 | Kitagawa |
| 2002/0179248 A1 | 12/2002 | Kabansky |
| 2003/0227258 A1 | 12/2003 | Strang et al. |
| 2004/0014325 A1 | 1/2004 | Laermer et al. |
| 2004/0025791 A1 | 2/2004 | Chen et al. |
| 2004/0071876 A1 | 4/2004 | Rakhimov et al. |
| 2004/0221958 A1 | 11/2004 | Loewenhardt et al. |
| 2005/0005859 A1 | 1/2005 | Koshiishi et al. |
| 2005/0025791 A1 | 2/2005 | Remenar et al. |
| 2005/0070105 A1 | 3/2005 | Bailey, III et al. |
| 2005/0098265 A1 | 5/2005 | Fink et al. |
| 2005/0211171 A1 | 9/2005 | Hanawa et al. |
| 2005/0211546 A1 | 9/2005 | Hanawa et al. |
| 2005/0211547 A1 | 9/2005 | Hanawa et al. |
| 2005/0287811 A1 | 12/2005 | Inukai |
| 2006/0000805 A1 | 1/2006 | Todorow et al. |
| 2006/0019039 A1 | 1/2006 | Hanawa et al. |
| 2006/0021701 A1 | 2/2006 | Tobe et al. |
| 2006/0102286 A1 | 5/2006 | Kim |
| 2006/0113037 A1 | 6/2006 | Nishio |
| 2007/0000611 A1 | 1/2007 | Shannon et al. |
| 2007/0017898 A1 | 1/2007 | Kumar et al. |
| 2007/0068624 A1 | 3/2007 | Jeon et al. |
| 2007/0186855 A1 | 8/2007 | Dhindsa |
| 2007/0247073 A1 | 10/2007 | Paterson et al. |
| 2008/0020574 A1 | 1/2008 | Marakhtanov et al. |
| 2008/0035608 A1* | 2/2008 | Thomas ................ C23C 16/452 216/67 |
| 2008/0060759 A1 | 3/2008 | Chen |
| 2008/0099426 A1* | 5/2008 | Kumar ..................... C23F 4/00 216/12 |
| 2008/0099431 A1 | 5/2008 | Kumar et al. |
| 2008/0099439 A1 | 5/2008 | Chang et al. |
| 2008/0160776 A1 | 7/2008 | Dhindsa et al. |
| 2008/0178805 A1 | 7/2008 | Paterson et al. |
| 2008/0193673 A1 | 8/2008 | Paterson et al. |
| 2008/0280429 A1 | 11/2008 | Mathew et al. |
| 2009/0114244 A1 | 5/2009 | Sexton et al. |
| 2009/0183833 A1 | 7/2009 | Kim |
| 2010/0000964 A1 | 1/2010 | Chen |
| 2010/0126668 A1 | 5/2010 | Koshiishi et al. |
| 2010/0206846 A1* | 8/2010 | Nishimura ........ C23C 16/45565 216/67 |
| 2010/0273332 A1 | 10/2010 | Edelberg |
| 2010/0276391 A1 | 11/2010 | Grimbergen et al. |
| 2011/0151673 A1 | 6/2011 | Noda et al. |
| 2011/0177694 A1 | 7/2011 | Chen et al. |
| 2011/0227276 A1 | 9/2011 | Asari et al. |
| 2011/0248634 A1 | 10/2011 | Heil et al. |
| 2012/0021355 A1 | 1/2012 | Kim et al. |
| 2012/0031559 A1 | 2/2012 | Dhindsa et al. |
| 2012/0034786 A1* | 2/2012 | Dhindsa ............ C23C 16/4412 438/710 |
| 2012/0104274 A1 | 5/2012 | Hirayanagi et al. |
| 2012/0273130 A1 | 11/2012 | Drewery et al. |
| 2012/0322011 A1* | 12/2012 | Wu ........................... G03F 7/40 430/432 |
| 2012/0322270 A1 | 12/2012 | Long et al. |
| 2013/0059448 A1 | 3/2013 | Marakhtanov et al. |
| 2013/0168352 A1 | 7/2013 | Fischer |
| 2013/0192759 A1* | 8/2013 | Setsuhara ............ C23C 16/509 156/345.35 |
| 2014/0054269 A1 | 2/2014 | Hudson et al. |
| 2014/0251790 A1 | 9/2014 | Kodaira et al. |
| 2014/0302678 A1 | 10/2014 | Paterson et al. |
| 2014/0302680 A1 | 10/2014 | Singh et al. |
| 2014/0302681 A1 | 10/2014 | Paterson et al. |
| 2015/0011093 A1 | 1/2015 | Singh et al. |
| 2015/0017810 A1 | 1/2015 | Guha |
| 2015/0179465 A1 | 6/2015 | Singh et al. |
| 2015/0206775 A1 | 7/2015 | Hudson et al. |
| 2015/0364339 A1 | 12/2015 | Guha |
| 2015/0364349 A1 | 12/2015 | Guha |
| 2016/0086795 A1 | 3/2016 | Paterson et al. |
| 2016/0141188 A1 | 5/2016 | Singh et al. |
| 2016/0148786 A1 | 5/2016 | Marakhtanov et al. |
| 2016/0181130 A1 | 6/2016 | Singh et al. |
| 2016/0203990 A1 | 7/2016 | Singh et al. |
| 2016/0211156 A1 | 7/2016 | Singh et al. |
| 2016/0358784 A1 | 12/2016 | Hudson et al. |

FOREIGN PATENT DOCUMENTS

| | | |
|---|---|---|
| CN | 102190164 A | 9/2011 |
| CN | 102405512 A | 4/2012 |
| CN | 102834905 A | 12/2012 |
| CN | 202633210 U | 12/2012 |
| CN | 103053012 A | 4/2013 |
| CN | 103140915 A | 6/2013 |
| EP | 0 756 309 A1 | 1/1997 |
| JP | S6260146 A | 3/1987 |
| JP | H04137727 A | 5/1992 |
| JP | H04341744 A | 11/1992 |
| JP | H07235397 A | 9/1995 |
| JP | 2604684 B2 | 4/1997 |
| JP | 2643457 B2 | 5/1997 |
| JP | H1041276 A | 2/1998 |
| JP | H10242116 A | 9/1998 |
| JP | 11-219938 A | 11/2001 |
| JP | 2010512031 A | 4/2010 |
| JP | 2012531520 A | 12/2012 |
| TW | 200715362 A | 4/2007 |
| TW | 200841775 A | 10/2008 |
| TW | 200924051 A | 6/2009 |
| TW | 201133605 A | 10/2011 |
| TW | 201145383 A | 12/2011 |
| TW | 201229299 A | 7/2012 |
| TW | 201250778 A1 | 12/2012 |
| WO | WO 2008/036210 A2 | 3/2008 |
| WO | WO 2008/070181 A2 | 6/2008 |

(56) References Cited

FOREIGN PATENT DOCUMENTS

| WO | WO 2013/036371 A2 | 3/2013 |
|---|---|---|
| WO | WO 2013/065531 A1 | 5/2013 |

OTHER PUBLICATIONS

U.S. Office Action, dated Jan. 14, 2015, issued in U.S. Appl. No. 13/916,318.
U.S. Office Action, dated Feb. 10, 2015, issued in U.S. Appl. No. 13/939,709.
U.S. Notice of Allowance, dated Jan. 16, 2015, issued in U.S. Appl. No. 13/936,930.
U.S. Office Action, dated Oct. 11, 2013, issued in U.S. Appl. No. 13/626,793.
U.S. Final Office Action, dated Feb. 13, 2014, issued in U.S. Appl. No. 13/626,793.
U.S. Office Action, dated Jul. 16, 2014, issued in U.S. Appl. No. 13/626,793.
U.S. Notice of Allowance, dated Jan. 2, 2015, issued in U.S. Appl. No. 13/626,793.
U.S. Office Action, dated May 21, 2014, issued in U.S. Appl. No. 13/227,404.
Wolf, S. and R.N. Tauber, R.N. (2000) "Silicon Processing for the VLSI Era," Chapter 14, Dry Etching for ULSI Fabrication, *Lattice Press*, ISBN 0-9616721-6-1, 1:673-676.
Xiao, (2001) "Introduction to Semiconductor Manufacturing Technology", *Published by Prentice Hall*, ISBN 0-13-022404-9, Chapter 7, p. 230.
U.S. Office Action, dated May 8, 2015, issued in U.S. Appl. No. 13/916,318.
U.S. Notice of Allowance, dated May 21, 2015, issued in U.S. Appl. No. 13/939,709.
U.S. Examiner's Amendment Communication, dated Jun. 26, 2015, issued in U.S. Appl. No. 13/939,709.
U.S. Office Action, dated May 15, 2015, issued in U.S. Appl. No. 14/184,491.
U.S. Patent Application entitled "Plasma-Enhanced Etching in an Augmented Plasma Processing System," Hudson et al., U.S. Appl. No. 15/237,521, filed Aug. 15, 2016.
U.S. Notice of Allowance, dated Oct. 7, 2015, issued in U.S. Appl. No. 13/916,318.
U.S. Office Action, dated Mar. 10, 2016, issued in U.S. Appl. No. 14/832,539.
U.S. Notice of Allowance, dated Jun. 2, 2016, issued in U.S. Appl. No. 14/832,539.
U.S. Notice of Allowance, dated Oct. 2, 2015, issued in U.S. Appl. No. 14/637,260.
U.S. Notice of Allowance, dated Aug. 28, 2015, issued in U.S. Appl. No. 14/184,491.
U.S. Office Action, dated Feb. 17, 2016, issued in U.S. Appl. No. 14/954,586.
U.S. Final Office Action, dated Aug. 25, 2016, issued in U.S. Appl. No. 14/954,586.
U.S. Office Action, dated Oct. 1, 2015, issued in U.S. Appl. No. 14/676,711.
U.S. Notice of Allowance, dated Apr. 20, 2016, issued in U.S. Appl. No. 14/676,711.
U.S. Office Action, dated Jul. 5, 2016, issued in U.S. Appl. No. 13/339,312.
U.S. Final Office Action, dated Dec. 16, 2014, issued in U.S. Appl. No. 13/227,404.
U.S. Office Action, dated Apr. 21, 2015, issued in U.S. Appl. No. 13/227,404.
U.S. Final Office Action, dated Nov. 5, 2015, issued in U.S. Appl. No. 13/227,404.
U.S. Examiner's Answer to Appeal Brief [Before the Patent Trial and Appeal Board], dated Oct. 20, 2016, issued in U.S. Appl. No. 13/227,404.
Chinese First Office Action dated Feb. 2, 2016 issued in CN Application No. 201410138510.5.
Chinese Second Office Action dated Jul. 28, 2016 issued in CN Application No. 201410138510.5.
Chinese First Office Action dated Jan. 28, 2016 issued in CN Application No. 201410138310.X.
Chinese Second Office Action dated Jul. 22, 2016 issued in CN Application No. 201410138310.X.
Chinese First Office Action dated Apr. 5, 2016 issued in CN Application No. 201410330530.2.
Chinese First Office Action dated Sep. 26, 2016 issued in CN Application No. 201410482626.0.
Chinese First Office Action dated Mar. 28, 2016 issued in CN Application No. 201410323125.8.
Chinese Second Office Action dated Oct. 28, 2016 issued in CN Application No. 201410323125.8.
Chinese First Office Action dated Jun. 3, 2016 issued in Application No. CN 201410138060.X.
Chinese First Office Action dated Sep. 17, 2015 issued in CN Application No. 2013-10379780.0.
Chinese Second Office Action dated May 17, 2016 issued in CN Application No. 2013-10379780.0.
PCT International Search Report dated Nov. 2, 2012 issued in PCT/US2012/051460.
PCT International Preliminary Report on Patentability and Written Opinion dated Apr. 10, 2014 issued in PCT/US2012/051460.
Wolf, S. and R.N. Tauber, R.N. (2000) "Silicon Processing for the VLSI Era," Lattice Press, ISBN 0-9616721-6-1, 1:672.
U.S. Office Action dated Dec. 1, 2016, issued in U.S. Appl. No. 14/082,009.
U.S. Notice of Allowance, dated Dec. 29, 2016, issued in U.S. Appl. No. 14/954,586.
U.S. Final Office Action, dated Feb. 13, 2017, issued in U.S. Appl. No. 13/339,312.
Chinese Third Office Action dated Jan. 19, 2017 issued in CN Application No. 201410138310.X.
Singapore Search and Examination Report dated Dec. 8, 2016 issued in SG 10201403999Y.
Chinese Second Office Action dated May 22, 2017 issued in CN Application No. 201410482626.0.
Chinese Second Office Action dated Jan. 18, 2017 issued in Application No. CN 201410138060.X.
Chinese Third Office Action dated Nov. 15, 2016 issued in CN Application No. 2013-10379780.0.
Taiwanese Notice of Allowance and Search Report dated Nov. 30, 2016 issued in TW 102130651.
Taiwanese Examination Report dated Mar. 3, 2017 issued in TW 105142615.
U.S. Appl. No. 15/594,572, filed May 13, 2017, Fischer.
U.S. Patent Application entitled "Internal Plasma Grid for Semiconductor Fabrication," Singh et al., U.S. Appl. No. 13/916,318, filed Jun. 12, 2013.
U.S. Patent Application entitled "Plasma-Enhanced Ethching in an Augmented Plasma Processing System,", Bailey et al., U.S. Appl. No. 13/623,793, filed Sep. 25, 2012.
U.S. Patent Application entitled "Dual Chamber Plasma Etcher With Ion Accelerator," Joydeep Guha, U.S. Appl. No. 13/939,709, filed Jul. 11, 2013.
U.S. Patent Application entitled "Ion Beam Etching System," Singh et al., U.S. Appl. No. 13/936,930, filed Jul. 8, 2013.
Suda et al., (2012) "Development of Cu Etching Using O2 Cluster Ion Beam under Acetic Acid Gas Atmosphere", Japanese Journal of Applied Physics, 51:08HA02-1-08HA02-5.
U.S. Final Office Action dated Jun. 12, 2017, issued in U.S. Appl. No. 14/082,009.
U.S. Appl. No. 15/702,541, filed Sep. 12, 2017, Dhindsa et al.

* cited by examiner

ION TO NEUTRAL CONTROL FOR WAFER PROCESSING WITH DUAL PLASMA SOURCE REACTOR

CROSS-REFERENCE TO RELATED APPLICATION

This application is a continuation-in-part of U.S. application Ser. No. 12/850,552 (now issued as U.S. Pat. No. 8,869,742), titled "PLASMA PROCESSING CHAMBER WITH DUAL AXIAL GAS INJECTION AND EXHAUST," filed Aug. 4, 2010.

BACKGROUND

One operation frequently employed in the production of semiconductors is an etching operation. In an etching operation, one or more materials are partly or wholly removed from a partially fabricated integrated circuit. Plasma etching is often used, especially where the geometries involved are small, high aspect ratios are used, or precise pattern transfer is needed. Typically, a plasma contains electrons, ions and radicals. The radicals and ions interact with a substrate to etch features, surfaces and materials on the substrate.

As device dimension shrink, plasma etching processes need to be increasingly precise and uniform in order to produce quality products. One driving factor for decreasing device dimensions is the push to provide more devices per substrate. A related factor is the move from planar to 3D transistor structures (e.g., FinFET gate structures for logic devices) and advanced memory structures (e.g., Magnetoresistive Random Access Memory (MRAM) and Resistive Random Access Memory (ReRAM)). In order to achieve such precise and uniform processes, different processes must be optimized based on several relevant factors (e.g., the application for which the device will be used, the chemistry involved, the sensitivity of the substrate, etc.). Among other factors, a few important variables that may be optimized in an etching process include the flux of ions to a substrate, the flux of radicals to a substrate, and the related ratio between these two fluxes.

Because different processes are optimized in different ways, an apparatus which is suitable for a first etching process may not be suitable for a second etching process. Due in part to limited space in processing facilities, as well as the cost of semiconductor fabrication equipment, it is desirable for a semiconductor fabrication apparatus to be able to provide a wide range of processing conditions over a substrate. Further, it may be desirable for a semiconductor apparatus to be able to provide a wide range of processing conditions over different parts of a substrate during processing to combat certain geometric non-uniformities. This consideration is especially important where large substrates (e.g., 300 mm and especially 450 mm diameter) are being processed, as the geometric non-uniformities are exacerbated in such large work pieces. In this way, a single apparatus may be used for many different applications to achieve uniform results. The techniques described herein are especially useful for performing multi-step etch processes such as those associated with FinFET structures and back-end-of-line (BEOL) processing such as certain dual Damascene processes, particularly when performed on large substrates. The disclosed embodiments may be particularly useful in certain advanced technology nodes such as the 40 nm node, the 10 nm node, and the 7 nm node.

SUMMARY

Certain embodiments herein relate to apparatus and methods for etching substrates. In one aspect of the embodiments herein, an apparatus for etching substrates includes (a) a reaction chamber, (b) a plate assembly positioned in the reaction chamber thereby dividing the reaction chamber into an upper sub-chamber and a lower sub-chamber, where the plate assembly includes: (i) a first plate, and (ii) a second plate including at least two substantially concentric plate sections that are independently rotatable with respect to the first plate, where the first plate and second plate have apertures extending through the thickness of each plate, (c) one or more gas inlets to the upper sub-chamber, (d) one or more gas outlets to the reaction chamber designed or configured to remove gas from the reaction chamber, and (e) a plasma generation source designed or configured to produce a plasma in the upper sub-chamber.

In some embodiments, the apparatus includes at least three substantially concentric plate sections. In these or other cases, at least some of the apertures in at least one of the plates of the plate assembly may have an aspect ratio between about 0.2-0.4. At least one of the plates of the plate assembly may have an open area between about 40-60%. In certain implementations, the plate sections of the second plate include an insulating material, and the first plate includes a conductive material. The upper sub-chamber may be divided into a plurality of concentric plasma zones separated by one or more insulating walls. In various embodiments, a controller may be used to implement an etching method. For example, the controller may be designed or configured to rotate one or more of the concentric plate sections to control center to edge etch conditions on the substrate. The controller may also be designed or configured to move at least a first concentric plate section relative to the first plate to orient the apertures of the first and second plates to control an ion to radical flux ratio.

In another aspect of the embodiments herein, an apparatus for etching substrates is provided, including (a) a reaction chamber having an upper sub-chamber and a lower sub-chamber, where the upper sub-chamber includes at least two substantially concentric plasma zones, where each plasma zone is isolated from other plasma zones by one or more insulating walls, (b) a plate assembly positioned between the upper sub-chamber and lower sub-chamber and including a first plate and a second plate, where each plate has apertures extending through the thickness of the plate, and where the second plate is rotatable with respect to the first plate, (c) one or more gas inlets to the upper sub-chamber, (d) one or more gas outlets to the lower sub-chamber designed or configured to remove gas from the lower sub-chamber, and (e) a plasma generation source designed or configured to produce a plasma in the upper sub-chamber.

The apparatus may also include a translation causing mechanism designed or configured to move at least one plate of the plate assembly towards and away from the other plate of the plate assembly, such that a distance between the first and second plate is variable. In some cases, at least one of the plates may be designed or configured to act as a showerhead for delivering gases to the upper or lower sub-chambers. There is typically some distance between the first and second plates. In some embodiments this distance is between about 1-6 mm. At least one plate of the plate assembly may be between about 3-20 mm thick. Various types of plasma generation sources may be used. In one example, the plasma generation source is designed or configured to produce an inductively coupled plasma. The number of concentric plasma zones may also vary. In some embodiments, the upper sub-chamber includes at least three substantially concentric plasma zones. Various implementations utilize a controller configured to perform an etching method. In one example, the controller is designed or configured to independently control plasma generation in the concentric plasma zones and thereby control center to edge conditions on the substrate. The controller may also be designed or configured to move at least one concentric plate section relative to the first plate to orient the apertures of the first and second plates to control an ion to radical flux ratio.

In a further aspect of the disclosed embodiments, a method of etching a substrate is provided, including (a) receiving a substrate in a reaction chamber of an etching apparatus including: (i) a plate assembly positioned in the reaction chamber and thereby dividing the reaction chamber into an upper sub-chamber and a lower sub-chamber, where the plate assembly includes a first plate and a second plate, where the second plate includes at least two concentric sections, where the concentric sections are independently rotatable with respect to the first plate, and where the first plate and second plate have apertures extending through the thickness of each plate, (ii) one or more gas inlets to the upper sub-chamber, (iii) one or more gas outlets to the lower sub-chamber designed or configured to remove gas from the lower sub-chamber, and (iv) a plasma generation source designed or configured to produce a plasma in the upper sub-chamber, (b) flowing a plasma generating gas into the upper sub-chamber and generating a plasma, (c) flowing neutral species present in the plasma from the upper sub-chamber, through the plate assembly, and into the lower sub-chamber, and (d) etching the substrate.

The method may also include aligning at least some apertures in the upper and lower plates of the plate assembly such that ions flow from the upper sub-chamber, through the plate assembly, and into the lower sub-chamber. In some cases, different flux ratios of radicals to ions are achieved through different portions of the plate assembly. For example, a first flux ratio of radicals to ions through a first portion of the plate assembly may be different from a second flux ratio of radicals to ions through a second portion of the plate assembly. In some embodiments, the method also includes controlling a flux ratio of radicals to ions through the plate assembly by rotating at least one of the concentric sections of the second plate. The method may also include applying a bias to a substrate support positioned in the lower sub-chamber. The bias applied to the substrate support may produce a plasma in the lower sub-chamber. In other cases, however, the bias applied to the substrate support does not produce a plasma in the lower sub-chamber. In certain cases, the method may include applying a bias to one or more plates of the plate assembly. In a particular embodiment, different levels of bias are applied to the different concentric plate sections of the second plate. The method may also include rotating one or more of the concentric plate sections to control center to edge etch conditions on the substrate.

In another aspect of the disclosed embodiments, a method of etching a substrate is provided, including (a) receiving a substrate in a reaction chamber of an etching apparatus having: (i) an upper sub-chamber and a lower sub-chamber, where the upper sub-chamber includes at least two substantially concentric plasma zones, where each plasma zone is isolated from other plasma zones by one or more insulating walls, (ii) a plate assembly positioned between the upper sub-chamber and lower sub-chamber and including a first plate and a second plate, where each plate has apertures extending through the thickness of the plate, and where the second plate is rotatable with respect to the first plate, (iii) one or more gas inlets to the upper sub-chamber, (iv) one or more gas outlets to the lower sub-chamber designed or configured to remove gas from the lower sub-chamber, and (v) a plasma generation source designed or configured to produce a plasma in the upper sub-chamber, (b) flowing plasma generating gas into and generating a plasma in each plasma zone, (c) flowing neutral species present in the plasmas from the plasma zones, through the plate assembly, and into the lower sub-chamber, and (d) etching the substrate.

The method may also include flowing plasma generating gas of a first composition into a first plasma zone and flowing plasma generating gas of a second composition into a second plasma zone to accomplish operation (b). The first composition and second composition may be different (e.g., they may include different gases, or different concentrations of the same gases). In these or other cases, operation (b) may include generating a first plasma in a first plasma zone and a second plasma in a second plasma zone, where the first plasma and second plasma have different densities. The method may also include controlling an ion to neutral flux ratio through the plate assembly by changing a distance between the first plate and second plate. In certain implementations, a first ion to neutral flux ratio from a first plasma zone, through the plate assembly and into the lower sub-chamber is different from a second ion to neutral flux ratio from a second plasma zone, through the plate assembly and into the lower sub-chamber.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "plate" and "grid" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Further, though the description often refers to "upper" and "lower" elements (or similarly to "top" and "bottom," "left" and "right," etc.) these descriptors are used in a non-limiting fashion, solely for the sake of clarity. One of ordinary skill in the art would understand that other configurations may be used, as well. In certain embodiments, elements which are described herein as "upper" and "lower" may become the "lower" and "upper" or "left" and "right" elements, for example.

Figure 1:
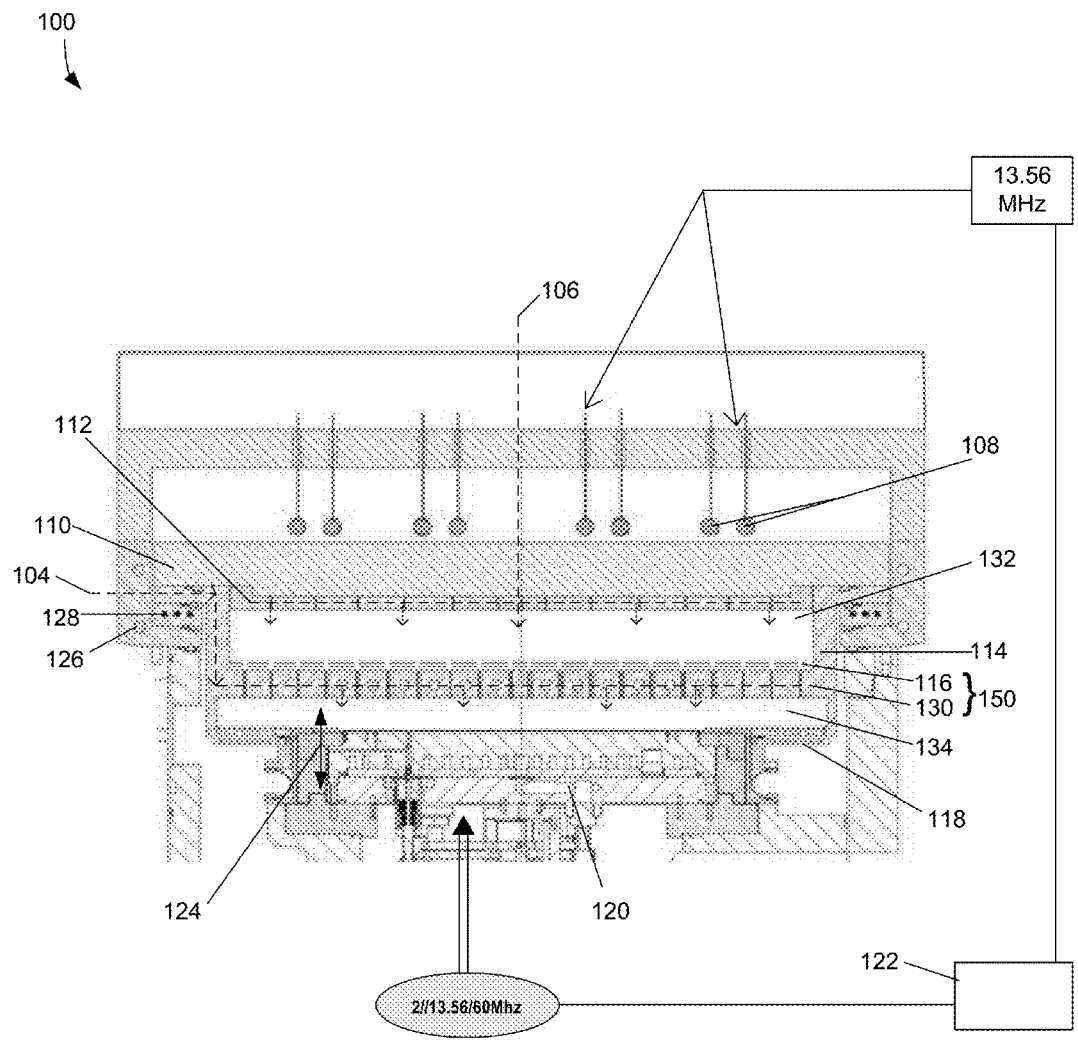
FIG. 1 shows an example of a plasma etching reactor according to a disclosed embodiment.

The embodiments herein generally deal with semiconductor processing methods and apparatus. More specifically, the embodiments relate to methods and apparatus for etching a semiconductor substrate. In practicing the disclosed techniques, a substrate is provided in a processing chamber. FIG. 1 shows a cross-sectional view of an appropriate processing apparatus 100. The reaction chamber is divided into an upper sub-chamber 132 and a lower sub-chamber 134 by a plate assembly 150. The plate assembly 150 includes an upper plate 116 and a lower plate 130. Each of the upper and lower plates 116 and 130 have apertures extending through the thickness of the plates. When the apertures in the upper and lower plates 116 and 130 are aligned, they permit the passage of ions and neutral species from the upper sub-chamber to the lower sub-chamber. When the apertures in the upper and lower plates 116 and 130 are not aligned, neutral species are able to pass through the misaligned apertures, while ions are substantially prevented from passing through.

Figure 2A:
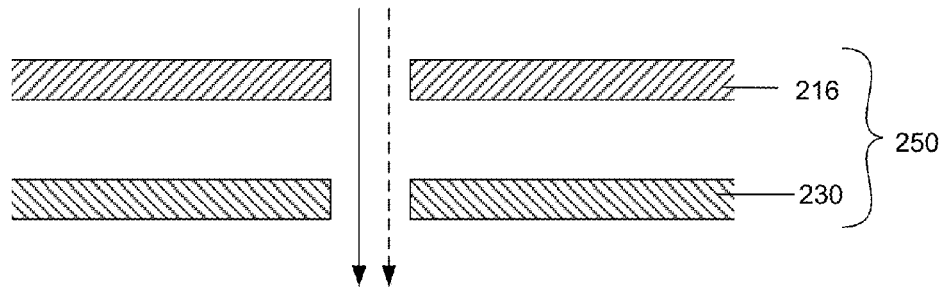
FIGS. 2A-2B show close-up views of aligned (FIG. 2A) and misaligned (FIG. 2B) apertures in a plate assembly, depicting which species are able to pass through the assembly in each case.
Figure 2B:
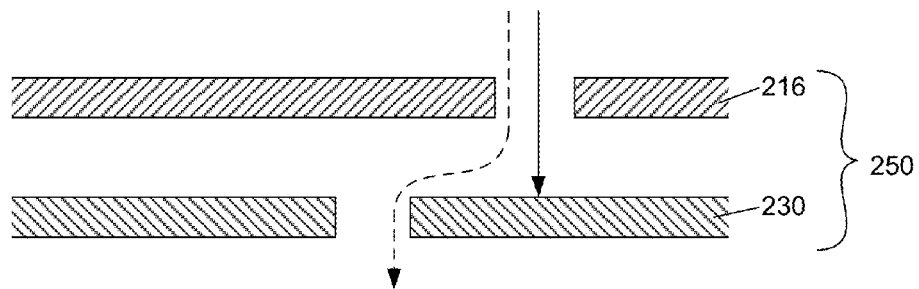
Figure 2C:
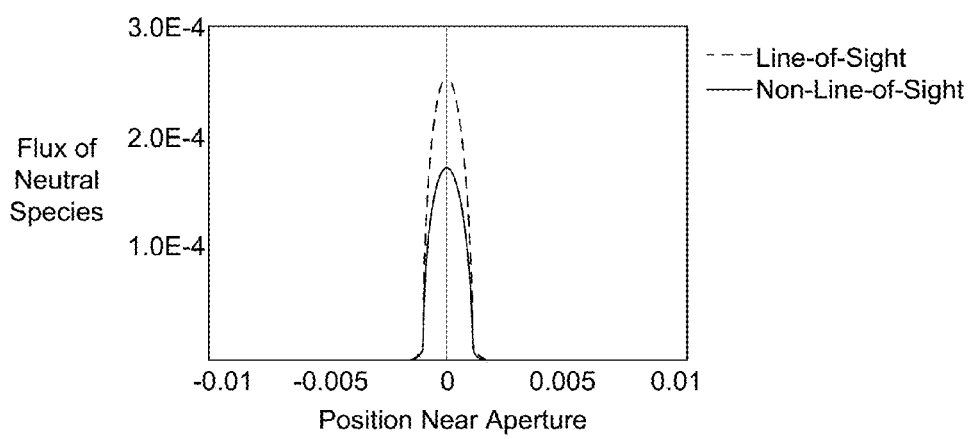
FIG. 2C is a chart showing the Flux of Neutral Species vs. Position Near Aperture for the line-of-sight (i.e., aligned) and non-line-of-sight (i.e., misaligned) cases.

This concept is shown in FIGS. 2A-2C. In FIG. 2A, the apertures in the upper plate 216 and lower plate 230 of the plate assembly 250 are aligned, and both ions (shown by the solid arrow) and neutral species (shown by the dotted arrow) are able to pass through into the lower sub-chamber. In FIG. 2B, the upper and lower plates 216 and 230 of plate assembly 250 are misaligned, and only the neutral species are able to pass through. FIG. 2C shows the flux of neutral species at an exit of the lower plate when the apertures in the upper and lower plates are aligned (line-of-sight case, shown by the dotted line) and when the apertures are mis-aligned (non-line-of-sight case, shown by the solid line). Although the total flux of neutrals is lower in the non-line-of-sight case, the decrease is only about 16%. This difference in neutral flux between the line-of-sight and non-line-of-sight cases is quite small when compared to the difference in ion flux between these two cases.

Returning to the embodiment of FIG. 1, additional details of the processing apparatus 100 will be provided. The upper sub-chamber 132 is configured to contain an inductively coupled plasma and the lower sub-chamber 134 is configured to contain a capacitively coupled plasma. Further, the volume of the lower sub-chamber 134 is adjustable, and the lower plate 130 is configured to operate as a gas delivery showerhead for delivering process gases from gas feed 104 to the lower sub-chamber 134. Process gases may be separately delivered to the upper sub-chamber 132 through gas feed 106, which feeds upper showerhead plate 112. In some cases, the upper showerhead plate 112 is made from a material such as silicon, silicon nitride, silicon carbide or quartz. The upper showerhead plate 112 may be slotted. Further, the upper showerhead plate 112 may move toward and away from the substrate to decrease or increase the amount of space between the upper and lower plates 116 and 130. This movement may help control the flux of radicals through the plate assembly 150 in certain embodiments.

Above the upper showerhead plate 112, there may be an insulator plate 110 (e.g., a ceramic insulator plate). TCP coils 108 may be situated above the insulator plate 110. In the embodiment of FIG. 1, dual TCP coils 108 are used. In embodiments where the upper zone plasma is not an inductively coupled plasma, these coils 108 may be absent. The reactor walls 114 surround the lower and upper sub-chambers 134 and 132, respectively. In some embodiments, the reactor walls 114 are made from anodized aluminum. The reactor walls 114 may also be coated with a protective material such as, for example, $Y_2O_3$, or another material designed to protect the semiconductor apparatus from harsh plasma conditions. Further, in various embodiments, the reactor walls 114 may include temperature control elements such as a temperature control heater ring 128. These temperature control elements help to produce desirable plasma conditions within the upper and lower zone plasmas.

Upper plate 116, sometimes also referred to as an injection control plate, is situated near the bottom of the upper sub-chamber 132. This upper plate 116 is rotatable about an axis normal to the face of the plate, and contains holes and/or slots which at least partially register with the slots/holes in the underlying lower plate 130. In the embodiment of FIG. 1, the upper plate 116 is insulating and the lower plate 130 is conductive and grounded. By rotating upper plate 116, the plate assembly open area changes, and different relative amounts of species from the upper zone plasma are able to travel through the plate assembly 150 and into the lower sub-chamber 132. The plate assembly open area (sometimes referred to more simply as assembly open area) is defined as the area of the plate assembly through which there is a clear line-of-sight from the upper sub-chamber 132 to the lower sub-chamber 134 at a given time. In other words, it represents the amount of area in which the apertures in the upper and lower plates 116 and 130 are aligned. The plate assembly open area may change based on the degree of alignment of the apertures in the plate assembly. The maximum plate assembly open area is defined as the highest assembly open area attainable for a given set of plates. Similarly, the term plate open area is defined as the area of a single plate through which there is a clear line-of-sight from the upper- to lower sub-chambers 132 and 134. In various embodiments, rotating upper plate 116 allows for tuning of the relative amounts of charged and neutral species passing from the upper to lower sub-chambers, as described elsewhere herein.

Other features highlighted in FIG. 1 include a pressure control ring 118 (often made from an insulating material such as quartz), a high power tunable electrostatic chuck 120, a coaxial RF switch 122, a cooling spacer ring 126 (often used to house fluid, including but not limited to water), and a temperature control heater ring 128. Further, distance 124 indicates that the height of the lower sub-chamber may be adjustable.

Methods

Figure 3A:
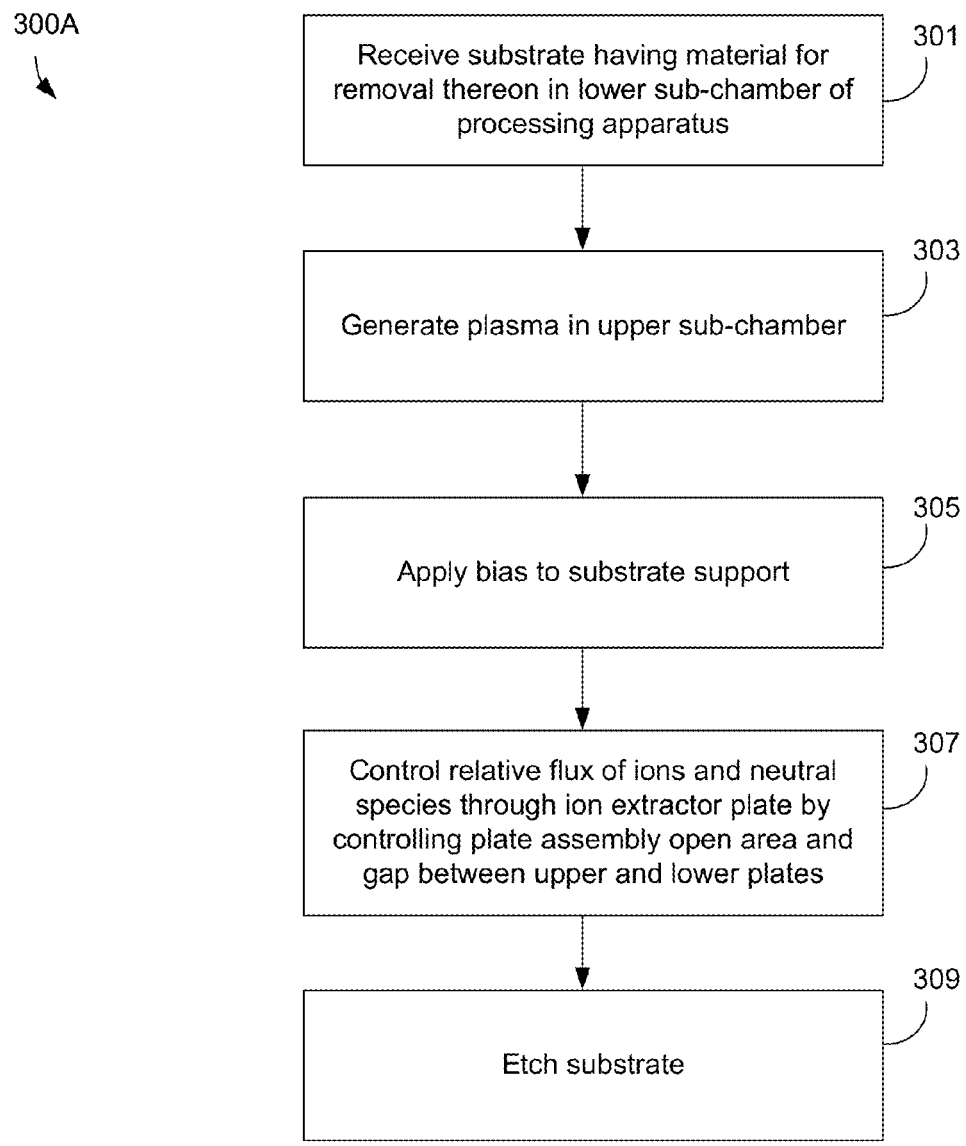
FIG. 3A is a flowchart illustrating a method of performing an etching operation according to a disclosed embodiment.

FIG. 3A provides a flow chart for etching a material in accordance with various embodiments herein. Process 300A begins at block 301, where a substrate having material for removal is received in the lower sub-chamber of a processing apparatus. An exemplary processing apparatus is described above in relation to FIG. 1. At block 303, plasma is generated in the upper sub-chamber of the processing apparatus. At block 305, a bias is applied to the substrate support. In some cases, this bias causes a plasma to form in the lower sub-chamber. In other cases, the bias may be sufficiently weak (e.g., in terms of frequency and/or applied power) such that there is substantially no plasma present in the lower sub-chamber. In either case, the bias acts to attract ions toward the substrate for processing. At block 307, the relative flux of ions and neutral species from the upper sub-chamber, through the ion extractor plate, and into the lower sub-chamber is controlled. The flux of ions is primarily controlled by changing the amount of plate assembly open area. Increasing the amount of plate assembly open area directly and substantially increases the ion flux through the plate assembly. Although increasing the plate assembly open area also increases the flux of neutral species, as shown in FIG. 2C, the flux of neutral species is significantly less affected by this open area, as compared to the flux of ions.

The flux of neutral species is primarily affected by the distance between the upper and lower plates. Increasing the distance between the two plates increases the amount of neutral species that are able to pass through. Wider gaps between the plates create more open, less tortuous paths through which the neutral species may travel to reach an aperture in the lower plate. In some implementations, the plate assembly open area and/or the distance between the upper and lower plate may change during processing of a substrate. Of course these variables may also change between processing different substrates, as may be needed for different types of applications. The process 300A continues at block 309, where the substrate is etched. In some cases, reactive etching chemistry may be provided to the upper and/or lower sub-chambers to help achieve the etching. In other cases, the etching is realized through ion etching without the help of reactive chemistry.

Figure 3B:
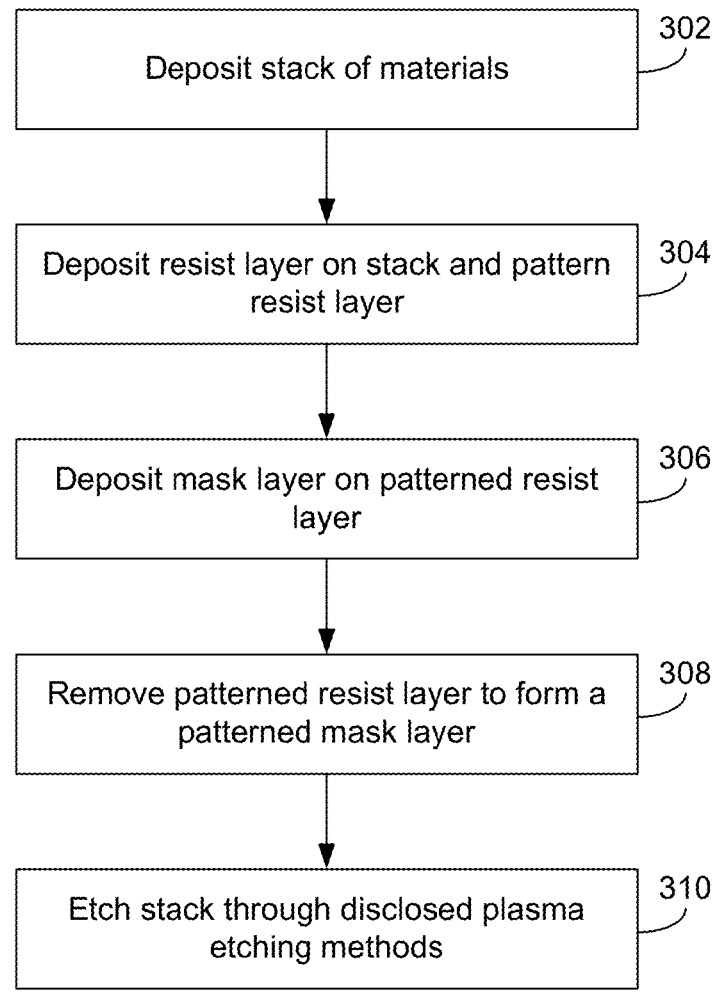
FIG. 3B is a flowchart illustrating a semiconductor fabrication context in which a disclosed etching operation may take place.

FIG. 3B illustrates an exemplary semiconductor fabrication process that may benefit from the disclosed techniques. In particular, FIG. 3B relates to a broader fabrication context in which the etching process described in FIG. 3A may take place. An example of this broader semiconductor fabrication method is further discussed and described in U.S. Pat. No. 6,689,283, titled DRY ETCHING METHOD, MICROFABRICATION PROCESS AND DRY ETCHING MASK; and U.S. Pat. No. RE40,951, titled DRY ETCHING METHOD FOR MAGNETIC MATERIAL, each of which is incorporated herein by reference in its entirety.

The process 300B begins at block 302, where a stack of materials is deposited on a substrate. In one embodiment, the stack is made of alternating layers of conductive and insulating materials. In various cases, the substrate on which the stack is deposited is a semiconductor wafer. Next, at block 304, a resist layer is deposited on the stack of alternating layers. The resist layer may be micro-patterned using a lithography technique. In a particular case, the patterned resist layer is e.g., a positive-type resist deposited using a spin-coating method and patterned using UV or electron-beam exposure equipment. At block 306, a mask layer is deposited on the patterned resist layer. In some cases, the mask layer is made of titanium nitride (TiN), which may be deposited through a reactive sputtering method.

Next, at block 308, the patterned resist layer is removed to form a patterned mask layer. In some embodiments, the removal may be accomplished through a lift-off method by dipping the substrate in a solvent bath and applying ultrasonic energy to remove the patterned resist. Next, the stack on the substrate may be etched at block 310 to form an etched stack. The etching may occur through the disclosed plasma etching techniques. For example, the process 300A shown in FIG. 3A may be implemented in operation 310.

Etching Mechanism

The techniques described herein may be beneficial in implementing a variety of etching processes that may occur through an assortment of mechanisms. In some cases, the removal of unwanted material may be accomplished through the use of ion etching (i.e., ion sputtering or ion milling) alone. In other embodiments, reactive chemistry is used along with ion exposure to facilitate material removal in a process referred to as reactive ion etching.

Ion etching generally refers to the removal of atoms by physical sputtering with an inert gas. Physical sputtering is driven by momentum exchange between the ions and the materials with which they collide. Upon impact, the incident ions set off collision cascades in the target. When such cascades recoil and reach the target surface with an energy greater than the surface binding energy, an atom may be ejected, known as sputtering.

Reactive ion etching generally refers to the removal of material through the action of chemically active ions and/or radicals, which may react with the unwanted material to aid in its removal. Where reactive chemistry is used, one purpose of the ions may be to activate the surface for reaction. Without wishing to be bound by any theory or mechanism of action, it is believed that ion bombardment may generate active sites on the substrate by creating dangling bonds and/or other physicochemically receptive features on the metal or other material to be etched. In some cases, a combination of ion sputtering and radical induced reactions are used.

During processing, gas may be delivered solely to the upper sub-chamber, solely to the lower sub-chamber, or to both sub-chambers. The gases delivered to each sub-chamber may be the same or different (e.g., different gases, or different concentrations of the same gases). The gas used to create the plasmas may be chosen to reduce or eliminate unwanted reactions in the reaction chamber, based in part on the etching chemistry used and the material to be etched. The materials listed herein are merely exemplary and are not meant to limit the embodiments in any way. One of ordinary skill in the art would understand that the techniques herein may be used with a variety of materials and reactions.

In some cases, the gas delivered to the upper and/or lower sub-chamber contains an inert gas such as Ar, He, Ne, Kr, etc. Where etching is achieved through ion sputtering, inert gases may be the only gases supplied to the sub-chambers. However, where etching occurs through reactive ion etching, the gas delivered to the upper and/or lower sub-chamber may include a reactive gas (e.g., an etchant and/or an additional reactive processing gas). Examples of reactive gases that may be used include flourocarbons ($C_xF_y$), hydrocarbons ($C_xH_y$), hydrogen ($H_2$), oxygen ($O_2$), nitrogen ($N_2$), methane ($CH_4$), carbon tetrafluoride ($CF_4$), chlorine ($Cl_2$), hydrogen bromide (HBr), ammonia ($NH_3$), phosphorus trifluoride ($PF_3$), carbonyl fluoride ($COF_2$), carbon monoxide (CO), nitric oxide (NO), methanol ($CH_3OH$), ethanol ($C_2H_5OH$), acetylacetone ($C_5H_8O_2$), hexafluoroacetylacetone ($C_5H_2F_6O_2$), thionyl chloride ($SOCl_2$), thionyl fluoride ($SOF_2$), acetic acid ($CH_3COOH$), pyridine ($C_5H_5N$), and/or formic acid (HCOOH). In various embodiments, a combination of these etching reactants is used. For example, in some cases a combination of CO+NO is used. In another case, a combination of $CO_2+NO_2$ is used. In a further case, pyridine is combined with thionyl chloride and/or thionyl fluoride. In certain cases, reactive gases are only supplied to the upper or lower sub-chamber, while in other cases reactive gases may be supplied to both sub-chambers. Furthermore, in some embodiments, an additional process gas is delivered (e.g., to the lower sub-chamber) in order to perform a specific function. For example, the additional process gas may be provided to protect a surface (e.g., to protect a mask layer). The additional process gas may be provided before or during an etch process. In some implementations, a combination of inert and reactive gases are used.

Any type of gas inlets may be used, for example gas showerheads, central inlet nozzles, or a plurality of inlet nozzles located at different points in the sub-chambers (e.g., around the periphery of a sub-chamber). In one embodiment, the lower plate of the plate assembly is used as a gas distribution showerhead. In this case, the lower plate includes channels for delivering process gases to the lower sub-chamber.

A few particular possibilities for gas delivery will be specified, though these examples are not intended to limit the embodiments. In one implementation, one or more etchant species are delivered to the lower sub-chamber through the lower plate of the plate assembly, which acts as a showerhead. In another implementation, etchant is delivered to the lower sub-chamber through a port or ports that are not part of a showerhead. In a further implementation, both etchant and additional reactive processing gas are delivered to the upper sub-chamber. In yet another implementation, both etchant and additional reactive processing gas are delivered to the lower sub-chamber. In an additional implementation, described more fully below, distinct mixtures of gases may be supplied to different radial portions (e.g., concentric ring-shaped portions) of the upper sub-chamber.

In some implementations, the material to be etched is Si, $SO_2$, SiN, SiON, SiCOH, TiN, W, Al, a low-K material, a high-k material, etc. In certain embodiments, the substrate to be etched is a partially fabricated MRAM or ReRAM device. Further, the material to be etched may be a stack of materials deposited on a substrate. The stack may have alternating/interleaving layers of dielectric and conductive materials.

In some embodiments, additional process gases are used in combination with inert gas and reactive etch chemistry. These additional process gases may be "tuning gases" used to adjust the plasma conditions present in a plasma region. One condition that may be tuned through addition of a tuning gas is the degree of fragmentation of etching species. For example, in certain embodiments, oxygen, hydrogen and/or argon may be used to recombine certain fragmented etchant species. Other examples of tuning gases that may be used include the reactive gases listed above. The additional process gases may include gases used to passivate a surface (or a portion thereof) such that the surface is protected from etching. Examples of passivating gases include $H_2$, $Cl_2$, CxFy, CxHy etc.

Position of the Plate Assembly in the Reactor

The plate assembly is positioned in the reaction chamber, thereby dividing the reaction chamber into upper and lower sub-chambers. An example of a chamber suitable for modification to include a plate assembly as described herein is a Kiyo Reactor from Lam Research Corporation of Fremont, Calif. For context, the following description may be considered with reference to FIG. 1, which is further described above. In certain implementations, the plate assembly 150 is positioned such that the distance between the lower surface of the lower plate and the upper surface of the substrate is between about 10-50 mm. The height of the upper sub-chamber may be chosen based on, for example, power optimization considerations. Larger upper sub-chambers will require greater power usage in order to sustain a plasma in the larger region. In some embodiments, the height of the upper sub-chamber is between about 2-20 inches, for example between about 5-15 inches. In a particular embodiment, the upper sub-chamber has a height of about 11 inches.

The plate assembly should not be positioned too close to the wafer, as this may cause printing of the plate pattern to occur on the wafer's face. In other words, the pattern of slots/holes in the plate may undesirably appear on the face of the wafer after processing, causing severe etch non-uniformity on the substrate surface. For many applications, a separation distance of at least about 10 mm is sufficient.

Design of the Plate Assembly

A basic embodiment of the plate assembly is provided in this section. Additional details relating to alternative designs of the plate assembly can be found in the Promoting Radially Uniform Results section below.

The plate assembly includes two plates/grids having apertures therethrough. The plates are positioned on top of one another such that there is an upper plate and a lower plate separated by a small distance (e.g., between about 1-6 mm). The upper and lower plates are substantially parallel to one another (e.g., within about 10°). In some embodiments, the plates are between about 3-20 mm thick, for example between about 5-15 mm thick, or between about 6-10 mm thick. If a plate is too thick, or if the perforations in the plate are too small, the plate may block too many ions from passing through (i.e., ions will collide with the plate, sometimes on a sidewall of an aperture in the plate, instead of passing through it). If a grid is too thin, it may not be adequately rigid, it may not be able to withstand plasma processing, and it may need to be replaced fairly often. The grids should be sufficiently rigid such that they do not bow or otherwise bend when placed in the reaction chamber. This helps to ensure uniform etch results.

The plates may be made of a variety of materials including both insulating and conducting materials. Further, one or more of the plates may be coated. In embodiments where a bias is applied to a plate during etching, the material used to construct or coat the plate should be conductive. In various embodiments, one or more plates are constructed from or coated with metal or a metallic alloy. In these or other embodiments, one or more of the plates is constructed from an insulating material. In some cases, one or more plates may be coated with a hard carbon material. In some particular cases, the plates may be coated with a layer of $Y_2O_3$, $YF_3$, YAG, titanium nitride, or $CeO_2$. The grid material may or may not be anodized or otherwise passivated for, e.g., corrosion resistance. In one embodiment, the upper plate is made of an insulating material (e.g., quartz) and the lower plate is made of a conductive material (e.g., metal). Other configurations are possible within the scope of the disclosed embodiments.

The plate assembly generally spans a horizontal section of the chamber. Where the chamber is circular (as viewed from above or facing the work piece), the plate assembly will also be circular. This allows the assembly to effectively divide the reaction chamber into two sub-chambers. In certain designs, the shape of the plate assembly is defined by the geometry of the substrate (which is typically but not necessarily a circular wafer). As is well known, wafers are often provided in various sizes, such as 200 mm, 300 mm, 450 mm, etc. Other shapes are possible for square or other polygonal substrates or smaller/larger substrates. Thus, the cross-section of the plate assembly (as viewed from above) may have a variety of shapes and sizes. In some embodiments, there may be a distance of separation between the plate assembly and the chamber walls. This distance may help prevent arcing between the plate assembly and the chamber walls. In certain embodiments, this distance is about 3 cm or greater.

By changing the orientation of one plate relative to the other plate, the ratio of ion flux to radical flux (referred to as the flux ratio, defined as the ion flux/neutral flux) may be controlled. One way this control occurs is by rotating a plate such that the apertures in the upper and lower plates are aligned. As described in relation to FIGS. 2A-2B, aligned apertures permit the transfer of both ions and neutral species, while misaligned apertures largely only permit the transfer of neutral species. Another way this control occurs is by changing the distance between the two plates. A wider distance between the plates results in a higher radical flux through the plate assembly, while a narrower distance results in a lower radical flux.

The apertures on the plates may take various shapes. For example, the apertures could be circular holes, slots, C-shaped apertures, T-shaped apertures, etc. The apertures may be oriented such that an axis extending through the center of the aperture is normal to the face of the plate. In a particular embodiment, all of the apertures are oriented in this manner. In another embodiment, some of the apertures may be oriented at a non-perpendicular angle relative to the plate. The apertures on the upper and lower plates may be the same shape or may be different. The alignment of the apertures on the upper and lower plates may be the same or may be different. The apertures are designed such that when the plates rotate relative to one another, the amount of plate assembly open area changes. In some cases, the perforations may be designed such that little or no current is induced in a plate during plasma generation. One design which ensures this result is a plate having radially directed slots. Where the apparatus is not designed to prevent this type of problem, a current may be induced to flow substantially circularly around the plate or to flow in small eddy currents on the grid, resulting in increased parasitic power consumption.

The aspect ratio of the apertures is defined as the width/diameter of an aperture divided by the depth of the aperture. Because the apertures extend through the thickness of each plate, the depth of the aperture is equal to the plate thickness. The aspect ratio of the slots should be sufficiently small such that plasma does not ignite within the apertures. The appropriate aspect ratio will depend on the plasma conditions present in the upper sub-chamber. For example, where the upper sub-chamber contains a high pressure/high density plasma, the aspect ratio should be somewhat smaller. Similarly, where the upper sub-chamber contains a low pressure/low density plasma, the aspect ratio may be somewhat larger (though there is flexibility in this case). Where a high pressure/density plasma is used, the thickness of the plasma sheath is lower. As such, plasma is more likely to exist within the aperture, if the aperture is sufficiently wide. This phenomenon should be avoided, for example by using an appropriately narrow aperture. In some embodiments, the aspect ratio of the apertures is between about 0.2-0.4. In these or other embodiments, the diameter or other principal dimension of an aperture may be between about 1-10 mm. The principal dimension is in a direction parallel to the work piece and spanning the longest linear path in an aperture.

Both the plate open area and the plate assembly open area, defined above, may be described in terms of absolute areas, or in terms of a percentage of the total area on the plate/assembly. For example, a 300 mm diameter plate has an area of roughly 700 $cm^2$. If the plate has about 350 $cm^2$ of open area, it may also be considered to have about 50% open area. In some cases the plate open area and the maximum assembly open area are equal. In other cases, the maximum plate assembly open area is lower than the plate open area for one or more plates. In some implementations, at least one plate has a plate open area between about 30-70% or between about 40-60%. In these or other implementations, the maximum plate assembly open area may be between about 30-70% or between about 40-60%.

As mentioned above, the plate assembly may also act as a showerhead for delivering gas to one or more of the sub-chambers. In a particular embodiment, the lower plate of the plate assembly acts as a showerhead for delivering gas to the lower sub-chamber. Similarly, the upper plate can be implemented as a showerhead for delivering gas to the upper sub-chamber. Where only a single plate of the assembly acts as a showerhead, it may be the non-moving plate, as this configuration presents fewer engineering considerations. A plate being used as a showerhead will typically include one or more channels connecting gas feed inlet(s) to a plurality of showerhead outlet holes.

In some implementations, the plate assembly has a region (e.g., a central region) containing a feature for allowing a probing apparatus to be disposed through the plate assembly. The probing apparatus can be provided to probe process parameters associated with the plasma processing system during operation. Probing processes can include optical emission endpoint detection, interferometric endpoint detection, plasma density measurements, ion density measurements, and other metric probing operations. In certain embodiments, the central region of the plate assembly is open. In other embodiments, the central region of the assembly contains an optically clear material (e.g., quartz, sapphire, etc.) to allow light to be transmitted through the grid.

In some embodiments, the plate assembly may include cooling channels embedded in one or more of the plates, and these cooling channels may be filled with a flowing or non-flowing coolant material. In certain embodiments, the cooling material is a fluid such as helium or other inert gas or a liquid such as deionized (DI) water, process cooling water, Fluoroinert™ from 3M, or a refrigerant such as perfluorocarbons, hydrofluorocarbons, ammonia and $CO_2$. In these or other embodiments, the plate assembly may include embedded heating elements and/or a temperature measurement device. The cooling channels and embedded heaters allow for precise temperature control, which permit close control over the particle and wall conditions. This control may be used to tune the conditions in the lower sub-chamber, in certain cases. For example, where the lower plate or plate assembly is maintained at a cooler temperature, etch byproducts from the wafer may preferentially deposit on the lower plate, thereby reducing the gas phase density of the etch byproducts in the lower sub-chamber. Alternatively, the lower plate or plate assembly may be maintained at an elevated temperature (e.g., above 80° C.) to reduce the deposition on the plate and ensure that the chamber can remain relatively clean and/or reduce the time required to clean the chamber during waferless auto clean (WAC).

In some embodiments, the plates do not move (rotate or translate) while an etch process is occurring. In such embodiments, the plates move between distinct steps, such as the individual steps of a multi-step etch process used to fabricate complex structures such as MRAM stacks or FinFET gates. In other embodiments, the plates may rotate and/or translate during processing. This helps provide additional flexibility for processing, for example, where it is desired to have a different ratio of ion flux:neutral flux (i.e., flux ratio) at different times in an etching process. In one particular example, the ratio of ion flux:neutral flux through the plate assembly is higher toward the beginning of an etch process and lower toward the end of an etch process. The opposite may be true in other implementations.

Additional details relating to alternative embodiments of the plat assembly are included in the Promoting Radially Uniform Results section below.

Upper Sub-Chamber Conditions and Configuration

During processing, the upper sub-chamber typically contains a plasma. The plasma may be generated by various methods. In the embodiment of FIG. 1, for example, the upper sub-chamber is configured to contain a high density (e.g., $10^{10}$ thru $10^{12}$ charged particles/cm$^3$) inductively coupled plasma. In other embodiments, the upper sub-chamber may be configured to contain a capacitively coupled plasma. Whatever plasma generation technique is used, the plasma in the upper sub-chamber may be referred to as a Radically Coupled Plasma (RCP). This term refers to a plasma that is spatially removed from the processing area directly surrounding the substrate, from which radicals may be tunably extracted for the purpose of processing a substrate. In this description, the phrase "tunably extracted" means that the relative flux of radicals and ions (the flux ratio) may be tuned as desired for and/or during a particular process.

Process gases that may be delivered to the upper sub-chamber are described above in the Etching Mechanism section.

In certain embodiments, the power used to drive plasma formation in upper sub-chamber is between about 0-10,000 W, for example between about 1,500-4,500 W. In a particular implementation the RF power used to drive plasma formation is about 3,000 W.

The pressure in the etching apparatus may be controlled by a vacuum pump. The vacuum pump may draw through exhaust ports on the reaction chamber. The exhaust ports may be located in the lower sub-chamber and/or in the upper sub-chamber. The exhaust ports may have variable/controllable conductance. The orientation of the plate assembly (e.g., the alignment of the apertures and the distance between the upper and lower plates) may also affect the pressure experienced in the sub-chambers. Specifically, these orientation characteristics may be tuned to provide an appropriate pressure gradient between the upper and lower sub-chambers.

In one mode of operation, the upper sub-chamber is not used, and all plasma generation and processing occur in the lower sub-chamber. When practicing in this mode, the distance between the upper and lower plates of the plate assembly may be decreased to zero, and the apertures may be purposely misaligned such that there is no plate assembly open area. In this mode, the etching apparatus basically simplifies down to a single chamber conventional plasma etcher. All gases may be delivered directly to the lower sub-chamber, where the substrate is situated. A plasma may be generated in the lower sub-chamber, and the substrate may be etched according to conventional methods. The ability to close off the upper sub-chamber and operate under conventional methods increases the flexibility and usefulness of the apparatus.

Lower Sub-Chamber Conditions and Bias Applied to Substrate Supporter

In various embodiments, a bias may be applied to the substrate supporter during etching. Generally, where a substrate supporter (e.g., an electrostatic chuck) is biased, the substrate is also biased. In some cases, the bias frequency is sufficiently large (e.g., about 60 MHz) such that a capacitively coupled plasma forms in the lower sub-chamber. In other cases, the bias frequency is much smaller (e.g., about 10 MHz or lower) such that there is substantially no plasma present in the lower sub-chamber during etching. In some embodiments, the power used to bias the substrate support is sufficiently low such that substantially no plasma is present in the lower sub-chamber, even where the frequency of the bias is otherwise high enough to support plasma formation in this region. It may be beneficial to have a plasma present in the lower sub-chamber during etching in some embodiments. For example, where an etchant species is present in the lower sub-chamber and it is desired to dissociate the etchant into more/smaller fragments, the existence of a plasma in the lower sub-chamber may help promote such dissociation. Other factors which may affect the degree of fragmentation of an etchant species include the density and effective electron temperature of plasma in the lower sub-chamber.

The gases supplied to the lower sub-chamber may include any of the gases listed above in the Etching Mechanism section.

The bias applied to the substrate support affects the energy level of ions striking the substrate. As such, the bias may be tuned to provide an appropriate level of ion energy for a particular application. Other factors which affect the ion energy include the power supplied to the plasma sources in the upper sub-chamber, the electric field gradient across the plate assembly (which may be controlled by the bias applied to the lower plate of the assembly), and the pressure gradient between the upper and lower sub-chambers.

Bias Applied to Plate Assembly

In some embodiments, a bias may be applied to one or more plates of the plate assembly. In one example, a negative bias is applied to the lower plate of the plate assembly. In this way, ions produced in the upper sub-chamber and passing through the plate assembly may be accelerated towards the substrate at a particular ion energy. The bias on the plate may be tuned to provide a desired ion energy.

Promoting Radially Uniform Results

When etching a substrate, certain non-uniformities may arise. In particular, radial non-uniformity is a common issue when etching substrates. In some instances, for example, etching may occur to a greater extent near a center area and edge area of a substrate while occurring to a lesser extent in a ring-shaped region between these two areas. These radial non-uniformities are heightened when larger substrates (e.g., 300 mm, and especially 450 mm substrates and larger) are being processed. It is desirable to reduce or eliminate these non-uniformities, where possible.

In some cases, the open area of the plate assembly is designed to provide different levels of ion flux to different parts of the substrate. For example, where the open area is concentrated toward the center of the plate assembly, the ions may act on the center region of the wafer to a greater extent than on the edges of the wafer. Likewise, where the plate assembly open area is concentrated near the edge of the plate assembly, the ions may act on the edge regions of the wafer to a greater degree than the center of the wafer. These techniques may be especially useful in combating centerto-edge non-uniformities. However, they may not afford sufficient flexibility in radial profiles of etching conditions at the substrate surface.

Figure 4A:
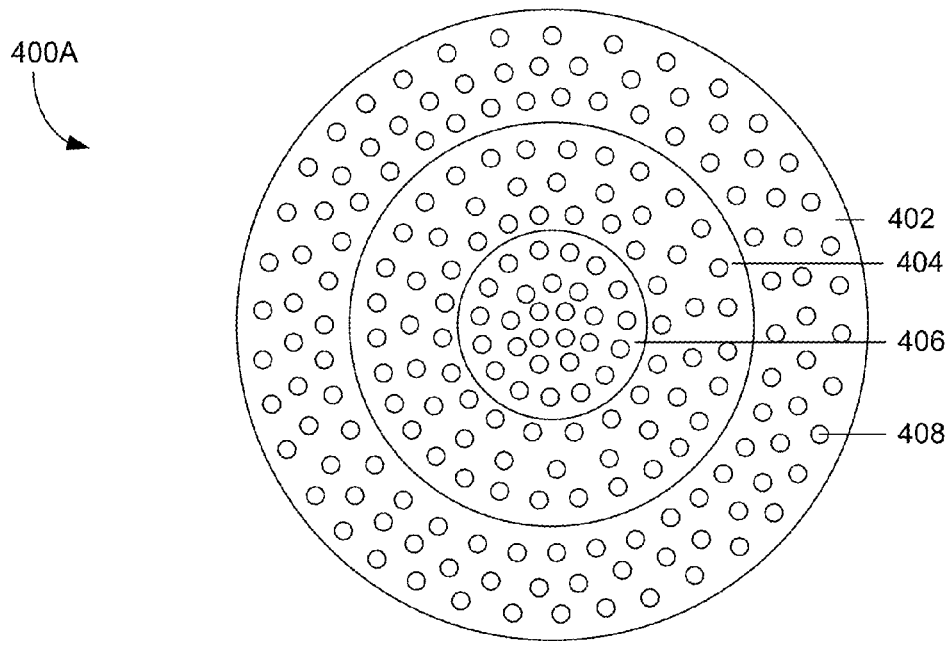
FIGS. 4A-4C show example series of injection control rings according to certain disclosed embodiments.
Figure 4B:
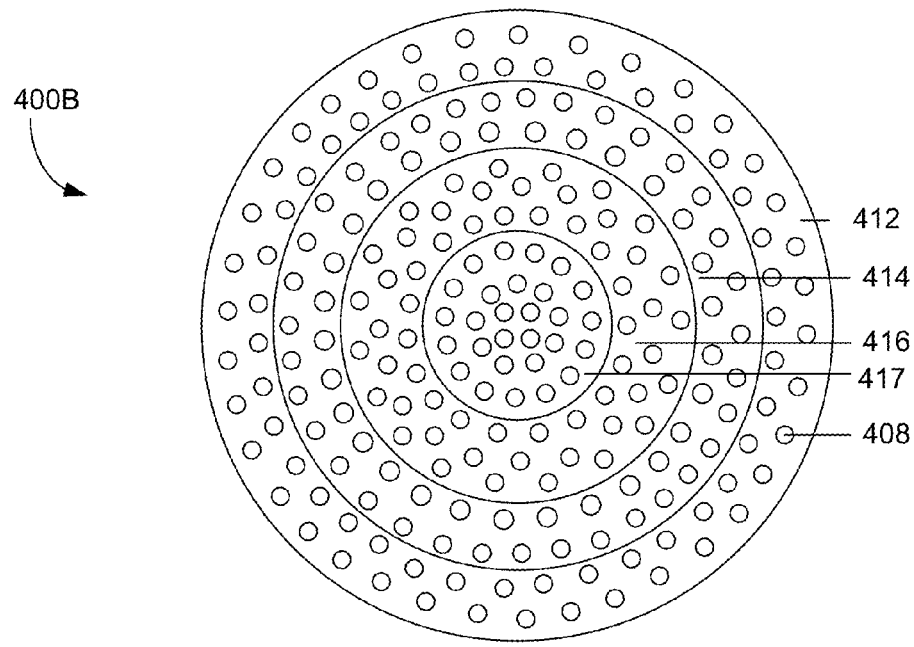
Figure 4C:
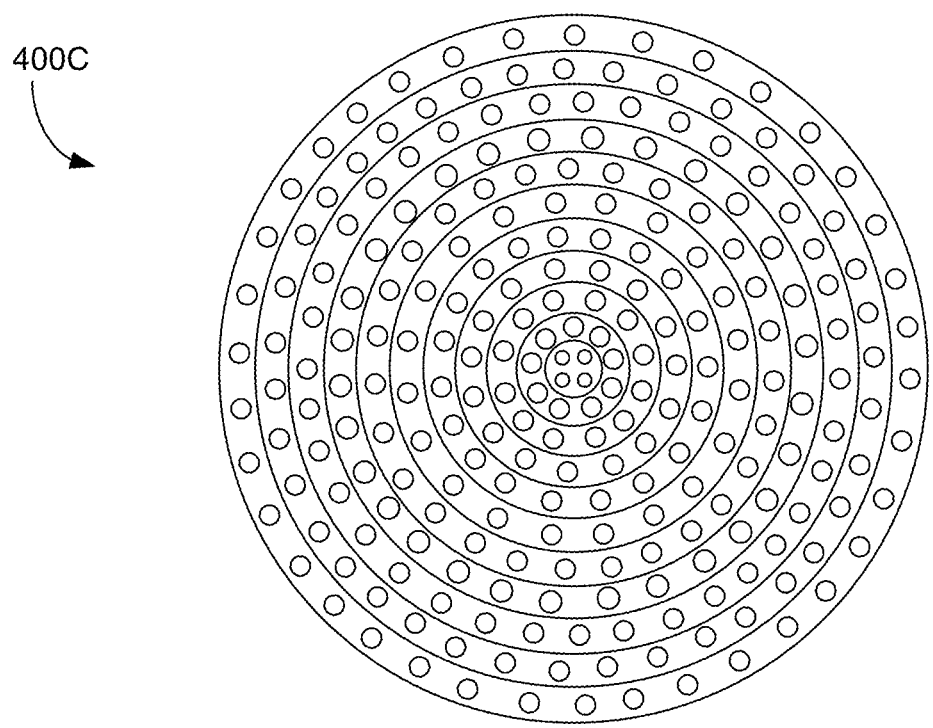

Another technique for addressing the radial non-uniformity issue is by implementing one or more of the plates of the plate assembly as a series of substantially concentric rings, instead of a single continuous plate. Where this is the case, the plate rings may be referred to as injection control rings, segments, or plate sections. Example collections of injection control rings/plate sections that may be used in place of an upper plate in the plate assembly are shown in FIGS. 4A-4C. With reference to FIG. 4A, the series of rings 400A includes an outer ring 402 and a middle ring 404 surrounding an inner plate 406. For the sake of simplicity, inner plate 406 will be referred to as a ring despite the fact that it may not have a hole in the center. Each ring includes a plurality of apertures 408 through which ions and radicals may travel (under appropriate conditions). The series of rings 400B shown in FIG. 4B includes four injection control rings (elements 412, 414, 416, and 417 from the outside inwards), rather than the three rings shown in FIG. 4A. In this embodiment, some injection control rings 412 and 414 include two concentric rows of apertures 408, while other injection control rings 416 and 417 include three concentric rows of apertures. Many varieties of aperture placement may be used. For example, in the set of injection control rings 400C shown in FIG. 4C, each injection control ring includes a single row of apertures. As used in this section, the "rows" of apertures are circularly shaped (i.e., the rows do not refer to linear rows). In the embodiment shown in FIG. 4C, each row of apertures may be rotated independently of the other rows, since each row is situated on its own dedicated injection control ring. While FIG. 4C shows a set of rings 400C having 11 different plate sections, for the sake of clarity the individual plate sections/injection control rings are not labeled.

In some embodiments, the density of apertures may vary between different injection control rings (e.g., a difference of at least 20%, or at least 50%), while in other embodiments the density of apertures is uniform or substantially uniform (e.g., within about 20%) between different injection control rings.

By implementing one of the plates as concentric rings, it is possible to easily radially tune the ratio of ion flux:radical flux. Each ring may be rotated independently to provide a desired amount of open area through which ions and radicals may travel. For example, an outer ring may be aligned such that ions can pass through the plate assembly to a maximum extent, while an inner ring may be aligned such that very few (or in some cases, even zero) ions can pass from the upper to lower sub-chamber.

Further, in some embodiments, each ring can independently move toward/away from the other plate of the plate assembly in order to tune the flux of radicals through each ring. Where this is the case, barriers should be used to connect adjacent edges of the injection control rings. In the context of FIG. 4 where the rings are configured to translate independently, a barrier should be included between the edge of inner plate 406 and the inner edge of middle ring 404. Similarly, a barrier should be included between the outer edge of middle ring 404 and the inner edge of outer ring 402. These barriers may be static, or they may move with the injection control rings. The purpose of the barriers is to prevent the plasma in the upper sub-chamber from leaking into the lower sub-chamber. The minimum height of the barriers is dictated by the difference in vertical position between adjacent injection control rings.

Where injection control rings are used, each control ring may be biased independently to provide controlled ion energy and flux through different control rings. In one embodiment, the upper plate of the plate assembly is implemented as a single continuous plate, and the bottom plate of the assembly is implemented as a series of three injection control rings. A first bias is applied to the outer injection control ring, a second bias is applied to the middle control ring, and a third bias is applied to the inner injection control ring/plate. The first, second and third bias may be set to different levels to control ion energy and flux as desired, particularly to promote radially uniform etch results. In some embodiments, defined segments or sectors of the bottom plate have independently controllable bias. In this way, ion energy and flux can be controlled radially and/or azimuthally with a desired level of granularity. In some cases, the biasing mechanism is a grid of electrodes. In some cases, an electrode may be provided for each hole in the bottom plate. The ratio of electrodes to bottom plate holes may be 1:1, 1:2, 1:3, 1:4, 1:5, etc.

Because each ring can move independently of the others, it is easy to achieve different plating conditions over different parts of the substrate. This control may result in more uniform etching results over the entire face of the substrate. This type of control is especially beneficial as the industry moves towards larger substrates (e.g., 450 mm diameter or greater), where radial control of etching conditions is more important. In some cases, the number of rings (including an inner center plate) is between about 2-10, or between about 3-5. Greater numbers of rings provide finer radial control over the etching conditions, but also entail greater engineering challenges. It has been observed that etch non-uniformity commonly assumes a "W" shape with the center and edge regions experiencing etch conditions that are more similar to one another than to the intermediate radial positions. In such settings, a plate assembly containing at least 3 rings may be effective for addressing the inherent non-uniformity in the radial etch profile. For example, an intermediate ring may be rotated to produce a relatively high ion:radical flux ratio in comparison to center and edge rings.

In some embodiments, the rings are the same width (for an annularly shaped ring this width is measured as the distance between the inner and outer radii, for a circularly shaped "ring" this width is the radius) or substantially the same width (e.g., within about 10%). In other embodiments, the rings may have different widths (e.g., the widths may vary by at least about 10%, at least about 30% or at least about 50%). Where the rings have different widths, the wider rings may be positioned at or toward the periphery of the series of rings, at or toward the center of the rings, or at an intermediate position. This flexibility permits the optimization of an etching process depending on a particular application and its related non-uniformities.

Either the upper or lower plate (or both) may be implemented as a series of injection control rings. In a particular embodiment, the upper plate is made of a series of injection control rings made of an insulating material. In another particular embodiment, the lower plate is made of a series of injection control rings made of a conductive material. Other configurations are possible, as well. Embodiments where the lower plate is stationary and the upper plate is made of a series of movable injection control rings may be preferable in terms of controlling temperatures, material behavior, particle formation, RF return issues, etc. However, either configuration may be used.

Where injection control rings are used, mechanisms (e.g., micro actuators built into the other plate of the plate assembly) should be included for independently moving (e.g., rotating and translating) each ring. The rotation causing mechanism and the translation causing mechanism may be implemented independently, or may be implemented as part of a single movement causing mechanism. In one embodiment, movement causing mechanisms are included in the non-moving plate (e.g., the lower plate), which cause the moving plate (e.g., the upper plate) to rotate and/or translate. The movement causing mechanism may include structures that extend outwards towards the peripheral walls of the reactor, and may extend through the non-moving plate. Where the apparatus includes insulating walls dividing the upper sub-chamber into distinct plasma zones (discussed below in this section), the movement causing elements may extend through these insulating walls.

Only a small degree of movement is typically required. For example, a rotation of between about 1-10°, or between about 1-5°, may be sufficient. In various implementations, the amount of angular rotation is set to permit maximum ion:radical flux ratio and minimum ion:radical flux ratio, and many or all ratios in between. For relatively small apertures, the required amount of rotation may be quite small. Similarly, only a relatively small amount of translation is used in most implementations. For example, in some embodiments, the apparatus is capable of independently translating each ring at least about 0.5 mm, or at least about 1 mm. In some cases, the rings may translate between about 0-10 mm. In some implementations, etching will be conducted such that the distance between the plate and ring of an assembly in one radial section is at least about 0.5 mm greater than the distance between the plate and ring of the assembly in a second radial section (the radial sections being coextensive with the injection control rings).

Figure 5:
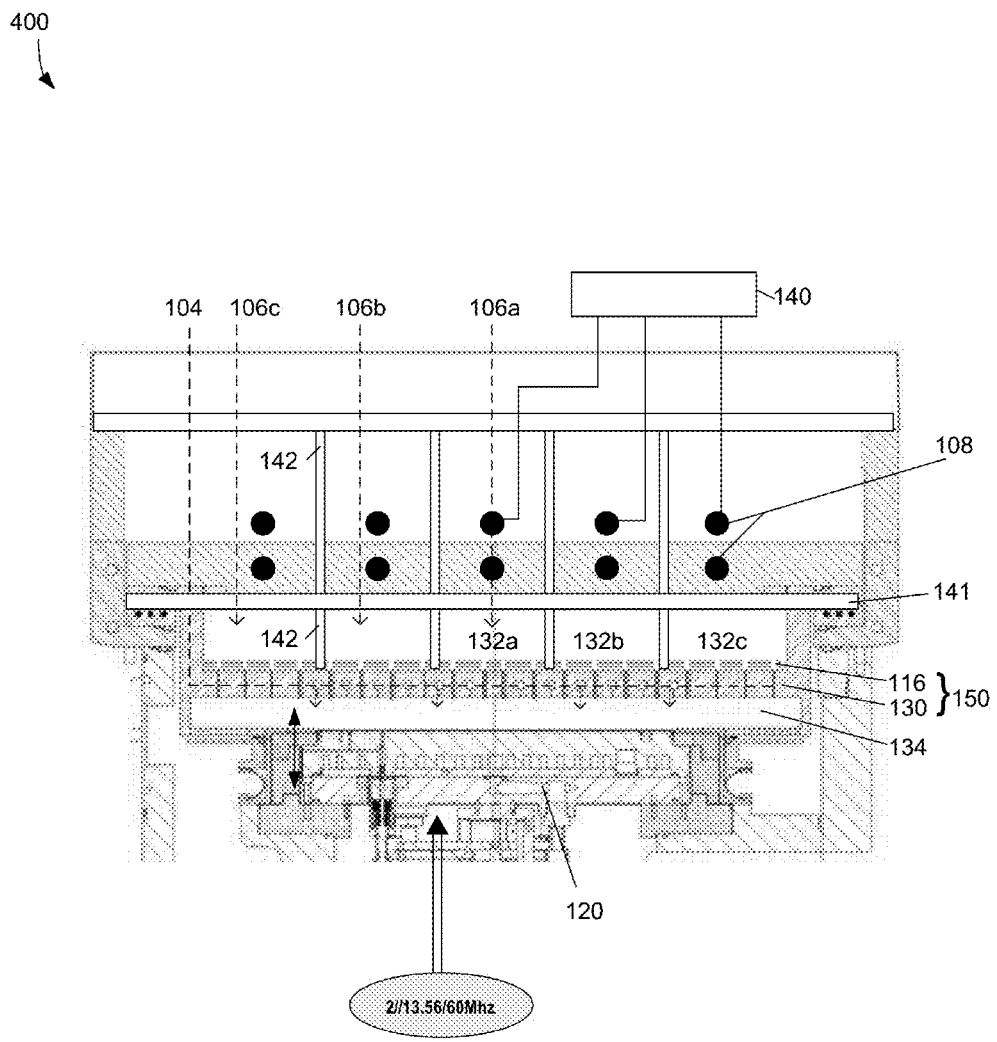
FIG. 5 shows an example of a plasma etching apparatus having multiple separate plasma zones according to a disclosed embodiment.

A further technique for addressing the issue of radial non-uniformity is to implement the upper sub-chamber as a series of concentric plasma zones, rather than a single continuous upper plasma zone. An apparatus for implementing this technique is illustrated in FIG. 5. The upper plasma zones may also be referred to more simply as plasma zones. Here, three plasma zones 132a, 132b and 132c are employed. In other embodiments, the number of plasma zones may range between about 2-10, or between about 3-5. In theory, any number of plasma zones may be used. Larger numbers of zones may be used to more finely tune the plasma conditions, while smaller numbers of zones are simpler to implement. As suggested above, many typical non-uniformity patterns can be addressed by having three radially separated sections with independent control of ion: radical flux ratios in the lower sub-chamber. In the embodiment depicted in FIG. 5, the innermost plasma zone 132a has a circular cross-section, as viewed from above. The other plasma zones 132b-c have annular cross-sections, as viewed from above, and surround the innermost plasma zone 132a. The plasma zones 132a-c are separated by insulating walls 142. In some cases, the insulating walls are made from a dielectric material such as ceramic or quartz, though other insulating materials may also be used. The purpose of the insulating walls 142 is to isolate each of the plasma zones 132a-c from one another.

Each plasma zone has a separate gas feed inlet. For instance, plasma zone 132a is fed by gas feed 106a, while plasma zone 132b is fed by gas feed 106b, etc. The gas feeds are fed to a showerhead plate 141, which is capable of maintaining separation between the gas feeds and delivering the correct feed to each plasma zone. Further, an independent power source is provided for each plasma zone. In the embodiment of FIG. 5, a multizone RF power supply 140 is used to independently provide power to the coils 108 proximate each plasma zone 132a-c. By providing each plasma zone 132a-c with a separate gas feed 106a-c and a mechanism for providing power to each zone independently, different types of plasma may be generated in each plasma zone 132a-c. The different plasmas can help combat center-to-edge non-uniformities that may otherwise arise during etching.

In some embodiments, different compositions of gas are delivered to the different plasma zones 132a-c. For instance, a gas may be delivered to some of the plasma zones while not being delivered to the other plasma zones. In one example, gas A may be delivered to plasma zones 132a and 132c, and not to plasma zone 132b. Similarly, in one embodiment a different tuning gas is delivered to each of the plasma zones 132a-c. Another way to achieve different compositions of gas in the different plasma zones is to deliver different relative concentrations of component gases to each plasma zone. In one example, plasma zones 132a-b receive a gas feed that is about 50% gas A and 50% gas B, while plasma zone 132c receives a gas feed that is about 75% gas A and about 25% gas B. As used in this section, gases A and B can represent any of the appropriate gases mentioned in the Etching Mechanism section.

Other factors which may be variable or constant between the plasma zones 132a-c include the total flow rate delivered to each plasma zone, the pressure in each plasma zone, the temperature in each plasma zone, the plasma density in each plasma zone, the power delivered to the plasma source for each zone, the frequency used to generate the plasma in each zone, etc.

In a particular embodiment, separated plasma zones are implemented together with a series of injection control rings. The number of rings and the number of plasma zones are typically equal, though this is not necessarily always the case. The control rings may be designed such that they are the same width as (or are slightly smaller than) the plasma zones, such that a particular injection control ring effectively serves as the bottom surface of a corresponding plasma zone.

Example Modes of Operation

The methods and apparatus disclosed herein allow for a wide variety of etching conditions to be achieved, both between processing different substrates or different steps of a multi-step etching processes, and within processing a single substrate in a single process. As such, the disclosed techniques may be used to implement many different kinds of etching operations. A few types or modes of operation will be mentioned for the sake of clarity and understanding. However, for the sake of brevity, certain types of processes that are enabled by the present disclosure will not be individually discussed. Further, the modes are described in an exemplary fashion, and details related to the modes may be altered according to a desired application. Certain variables (typically those that are not critical to operating the apparatus in a particular mode of operation) may be excluded from the discussion in the following sections.

Ion Bombardment Only

In this mode of operation, an inert gas is delivered to the upper sub-chamber and no etchant is used. Plasma is generated exclusively in the upper sub-chamber and there is substantially no plasma present in the lower sub-chamber. The energy of ions passing through the plate assembly into the lower sub-chamber may be tuned by controlling a bias applied to the lower plate of the assembly. In various cases, the electrostatic chuck is not biased when operating in this mode. The flux of ions to the substrate can be controlled by any of the mechanisms described herein (e.g., degree of alignment of apertures in plate assembly, injection control rings, distinct plasma zones, power supplied to generate plasma, etc.).

Ion Bombardment in the Presence of Etchant

In this mode, a plasma generating gas is delivered to the upper sub-chamber and an etchant is delivered to either sub-chamber or both. The etchant may be fragmented or unfragmented. Where the etchant is desired to be unfragmented, it should be delivered directly to the lower sub-chamber, and there should be substantially no plasma present in this region. The degree of fragmentation can be controlled by various mechanisms, most notably the presence of plasma in the lower sub-chamber. Fragmentation can be tuned by controlling parameters such as the electron temperature of the plasma and pressure in the lower sub-chamber.

In one example, an etchant may be fully dissociated or fragmented to produce fluorine species and similar atomic or near atomic species. Examples of such an etchant include $C_xF_y$ and $C_xH_y$ gases. Alternatively, the etchant may be partially fragmented to multi-atom etching components. In some cases the etchant species may be radicalized. The relative flux of ionic and neutral species (e.g., radicalized fragmented etchant species) passing through the plate assembly into the lower sub-chamber may be controlled by any of the mechanisms described herein (e.g., degree of alignment of apertures in plate assembly, injection control rings, distinct plasma zones, distance between upper and lower plate of the plate assembly, power supplied to generate plasma, flow of ion-generating and radical-generating gases into upper sub-chamber, etc.).

Etchant Only

In this mode of operation, plasma is generated exclusively in the upper sub-chamber and the lower sub-chamber is substantially free of plasma. The plate assembly open area is set to zero (i.e., the apertures in the upper and lower plates are completely or substantially completely misaligned). In this way, neutral species (e.g., radicalized etchant species) may pass through the plate assembly from the upper to lower sub-chamber, while ions are completely or substantially completely prevented from entering the lower sub-chamber. The flux of neutral species may be controlled by, for example, changing the distance between the upper and lower plates of the plate assembly.

Deposition/Passivation

In this mode of operation, an additional process gas is delivered to the lower sub-chamber in order to form a protective layer on parts of the substrate. In one example, $SiCl_4$ is delivered to help protect a mask layer. Other gases that may be used as passivating gases include, but are not limited to, $C_xF_y$, $C_xH_y$, COS, $H_2$, HBr, etc. In another example, the additional process gas acts to protect the sidewalls of a trench or another feature. This additional process gas may be delivered separately (i.e., while etching is not occurring, for example immediately prior to an etching operation), or it may occur during an etching process.

Plasma in the Lower Sub-Chamber

Plasma may be present in the lower sub-chamber in various modes of operating the etch reactor. In one mode of operation, the upper sub-chamber is not used. The upper and lower plates of the plate assembly are positioned such that they are in contact with one another (i.e., the distance between them is decreased to zero), and the apertures are completely misaligned. Plasma generating gas (which can contain one or more of the gases mentioned in the Etching Mechanism section above) is delivered directly to the lower sub-chamber, and a plasma is generated in this region. In this mode of operation, the etching apparatus basically simplifies into a conventional single chamber etch reactor.

Where plasma is present in the lower sub-chamber, the plasma is typically generated by applying a high frequency bias to the electrostatic chuck/substrate support. Alternatively, the plates may be designed to permit plasma to leak from the upper sub-chamber to the lower sub-chamber in certain implementations. In various embodiments where a plasma is present in the lower sub-chamber, an etchant species is present, though this is not necessarily always the case.

Apparatus

The methods described herein may be performed by any suitable plasma etching apparatus having the described modifications (e.g., a plate assembly, injection control rings and/or separate plasma zones, etc.). A suitable apparatus includes hardware for accomplishing the process operations and a system controller having instructions for controlling process operations in accordance with the present invention. For example, in some embodiments, the hardware may include one or more process stations included in a process tool.

System Controller

In some embodiments, a system controller (which may include one or more physical or logical controllers) controls some or all of the operations of a process tool. The system controller will typically include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing, mixture of process gas components (e.g., the composition of the etchant gas, the composition of the gas used to generate the plasma, any other process gases, etc.), chamber pressure, chamber temperature, wafer temperature, current and potential applied to the chuck/wafer and any other electrodes, the bias applied to each of the grids of the grid assembly, the bias applied to the electrostatic chuck, wafer position, plate position, and other parameters of a particular process performed by the process tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequence instructions for controlling the various parameters described above. For example, each phase of an etching process may include one or more instructions for execution by the system controller. The instructions for setting process conditions for a plasma generation process phase may be included in a corresponding plasma generation recipe phase. In some embodiments, the etching recipe phases may be sequentially arranged, so that all instructions for an etching process phase are executed concurrently with that process phase.

Other computer software and/or programs may be employed in some embodiments. Examples of programs or sections of programs for this purpose include a substrate positioning program, an upper sub-chamber gas delivery composition control program, a lower sub-chamber gas delivery composition control program, a gas inlet timing control program, a plate assembly bias control program, a plate assembly position control program, an electrostatic chuck bias control program, a pressure control program, a heater control program, and a potential/current power supply control program. Any of the software/programs mentioned herein may contain instructions for modifying the relevant parameters during etching. In one example, a plate assembly bias control program may contain instructions to modify the bias to one or more plates of the plate assembly during etching. As a consequence, the ion energy of the ions traveling into the lower sub-chamber may be modified during the etch process.

In some cases, the controllers control one or more of the following functions: delivery of etchant or other processing gas to the lower sub-chamber, delivery of plasma generation gas to the upper sub-chamber, plasma generation conditions in the upper and/or lower sub-chamber, the bias applied to each plate of the plate assembly, rotation/translation of the plates in the plate assembly, etc. For example, the delivery of gas to the sub-chambers may be achieved by directing certain valves to open and close at particular times. This allows the controller to control both the timing of gas delivery, as well as the composition of the delivered gases. The controller may control plasma generation conditions by, for example, directing a power supply to provide power to a plasma generator (e.g., the coils of an ICP reactor) at particular frequencies/power levels. Further, the controller may control the plasma generation conditions by directing a flow of inert gas (and/or in some embodiments reactive gas) to enter the upper sub-chamber, or by controlling the pressure in the sub-chambers, or by controlling the temperature in the sub-chambers, etc. The controller may control the rotation/translation of the plates in the plate assembly by directing a rotational actuator and/or translational actuator to move the plates as desired. In some cases, the controller is designed or configured to rotate or translate a concentric plate section to control center to edge etch conditions on the substrate. Similarly, the controller may be designed or configured to move at least one concentric plate section relative to the first plate to orient the apertures of the first and second plates to control an ion to radical flux ratio. In one embodiment, the controller is designed or configured to independently control plasma generation in the concentric plasma zones and thereby control center to edge etch conditions on the substrate. The controllers may control these aspects based on sensor output (e.g., when current, current density, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. An apparatus for etching substrates comprising:
   (a) a reaction chamber,
   (b) a plate assembly positioned in the reaction chamber thereby dividing the reaction chamber into an upper sub-chamber and a lower sub-chamber, wherein the plate assembly comprises:
      (i) a first plate, and
      (ii) a second plate comprising at least two substantially concentric plate sections that are independently rotatable with respect to the first plate, wherein the first plate and second plate have apertures extending through the thickness of each plate,
   (c) one or more gas inlets,
   (d) one or more gas outlets designed or configured to remove gas from the reaction chamber, and
   (e) a plasma generation source designed or configured to produce a plasma in the reaction chamber.

2. The apparatus of claim 1, wherein the second plate comprises at least three substantially concentric plate sections.

3. The apparatus of claim 1, wherein at least some of the apertures in at least one of the plates of the plate assembly have an aspect ratio between about 0.2-0.4.

4. The apparatus of claim 1, wherein at least one of the plates of the plate assembly has an open area between about 40-60%.

5. The apparatus of claim 1, wherein the plate sections of the second plate comprise an insulating material and the first plate comprises a conductive material.

6. The apparatus of claim 1, wherein the upper sub-chamber is divided into a plurality of concentric plasma zones separated by one or more insulating walls.

7. The apparatus of claim 1, further comprising a controller designed or configured to rotate one or more of the concentric plate sections to control center to edge etch conditions on the substrate.

8. The apparatus of claim 1, further comprising a controller designed or configured to move at least a first concentric plate section relative to the first plate to orient the apertures of the first and second plates to control an ion to radical flux ratio.

9. An apparatus for etching substrates comprising:
(a) a reaction chamber comprising an upper sub-chamber and a lower sub-chamber, wherein the upper sub-chamber comprises at least two substantially concentric plasma zones, wherein each plasma zone is isolated from other plasma zones by one or more insulating walls,
(b) a plate assembly positioned between the upper sub-chamber and lower sub-chamber and comprising a first plate and a second plate, wherein each plate has apertures extending through the thickness of the plate, and wherein the second plate is rotatable with respect to the first plate,
(c) one or more gas inlets to the upper sub-chamber,
(d) one or more gas outlets to the lower sub-chamber designed or configured to remove gas from the lower sub-chamber, and
(e) a plasma generation source designed or configured to produce a plasma in the upper sub-chamber.

10. The apparatus of claim 9, further comprising a translation causing mechanism designed or configured to move at least one plate of the plate assembly towards and away from the other plate of the plate assembly, such that a distance between the first plate and second plate is variable.

11. The apparatus of claim 9, wherein at least one of the plates is designed or configured to act as a showerhead for delivering gases to the upper or lower sub-chambers.

12. The apparatus of claim 9, wherein a distance between the first plate and second plate is between about 1-6 mm.

13. The apparatus of claim 9, wherein at least one of the plates of the plate assembly is between about 3-20 mm thick.

14. The apparatus of claim 9, wherein the plasma generation source is designed or configured to produce an inductively coupled plasma.

15. The apparatus of claim 9, wherein the upper sub-chamber comprises at least three substantially concentric plasma zones.

16. The apparatus of claim 9, further comprising a controller designed or configured to independently control plasma generation in the concentric plasma zones and thereby control center to edge conditions on the substrate.

17. The apparatus of claim 9, further comprising a controller designed or configured to move at least one concentric plate section relative to the first plate to orient the apertures of the first and second plates to control an ion to radical flux ratio.

18. A method of etching a substrate comprising:
(a) receiving a substrate in a reaction chamber of an etching apparatus comprising:
(i) a plate assembly positioned in the reaction chamber and thereby dividing the reaction chamber into an upper sub-chamber and a lower sub-chamber, wherein the plate assembly comprises a first plate and a second plate, wherein the second plate comprises at least two concentric sections, wherein the concentric sections are independently rotatable with respect to the first plate, and wherein the first plate and second plate have apertures extending through the thickness of each plate,
(ii) one or more gas inlets,
(iii) one or more gas outlets designed or configured to remove gas from the reaction chamber, and
(iv) a plasma generation source designed or configured to produce a plasma in the reaction chamber,
(b) flowing a plasma generating gas into the reaction chamber and generating a plasma,
(c) flowing species present in the plasma through the plate assembly, and
(d) etching the substrate.

19. The method of claim 18, wherein a first flux ratio of radicals to ions through a first portion of the plate assembly is different from a second flux ratio of radicals to ions through a second portion of the plate assembly.

20. The method of claim 18, further comprising rotating one or more of the concentric plate sections to control center to edge etch conditions on the substrate.

* * * * *